(12) United States Patent
Kurosu

(10) Patent No.: US 10,256,912 B2
(45) Date of Patent: Apr. 9, 2019

(54) OPTICAL PHASE REGENERATION METHOD AND DEVICE

(71) Applicant: NATIONAL INSTITUTE OF ADVANCED INDUSTRIAL SCIENCE AND TECHNOLOGY, Tokyo (JP)

(72) Inventor: Takayuki Kurosu, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 90 days.

(21) Appl. No.: 15/123,122

(22) PCT Filed: Feb. 9, 2015

(86) PCT No.: PCT/JP2015/053491
§ 371 (c)(1),
(2) Date: Sep. 1, 2016

(87) PCT Pub. No.: WO2015/133227
PCT Pub. Date: Sep. 11, 2015

(65) Prior Publication Data
US 2017/0078025 A1    Mar. 16, 2017

(30) Foreign Application Priority Data
Mar. 4, 2014 (JP) ................................ 2014-041582

(51) Int. Cl.
*H04B 10/299* (2013.01)
*G02F 1/35* (2006.01)
(Continued)

(52) U.S. Cl.
CPC ......... *H04B 10/299* (2013.01); *G02F 1/3536* (2013.01); *G02F 1/3538* (2013.01);
(Continued)

(58) Field of Classification Search
CPC . H04B 10/299; H04B 10/5561; G02F 1/3536; G02F 1/39; G02F 1/3538;
(Continued)

(56) References Cited

U.S. PATENT DOCUMENTS 5,274,495 A * 12/1993 Shirasaki ................ G02F 1/395
359/330
5,386,314 A * 1/1995 Jopson .................. G02F 1/3536
359/326
(Continued)

FOREIGN PATENT DOCUMENTS

WO    2012-098911 A1    7/2012
WO    2013-111413 A1    8/2013

OTHER PUBLICATIONS

Seo et al, Bidirectional 60 GHz Radio on Fiber Systems using Cascaded SOA EAM Frequency Up Down converters, Jul. 2005, IEEE, All Pages.*
(Continued)

Primary Examiner — Kenneth N Vanderpuye
Assistant Examiner — Dibson J Sanchez
(74) Attorney, Agent, or Firm — McCormick, Paulding & Huber LLP

(57) ABSTRACT

In a signal regeneration device in which recovery of a signal quality which has been degraded during transmission in optical communication and extension of a transmission distance are achieved, the most representative method of quantizing an optical phase is a phase sensitive amplifier (PSA) and a technique that utilizes an optical parametric process through use of a highly nonlinear optical medium, but there is a demand for a technique of quantizing an optical phase which is not accompanied with an optical parametric gain, has small-sized elements, is easily integrated, and does not require high power pump light. By a technique of a hybrid optical phase squeezer (HOPS), when a phase of
(Continued)

input light is quantized to M levels (M>2), phase conjugate light of the input light and (M−1)th phase harmonic light of the input light are subjected to power modulation to be coherently added, so that quantization of the optical phase is performed through use of a simple four-wave mixing (FWM) that is not accompanied with the optical parametric gain and a general optical amplifier by using a general nonlinear optical medium such as silicon, and accordingly, a GER of equal to or higher than 30 dB can be obtained, even if a nonlinear optical element having a low nonlinearity is used.

4 Claims, 15 Drawing Sheets

(51) Int. Cl.
| | |
|---|---|
| G02F 1/39 | (2006.01) |
| H01S 5/50 | (2006.01) |
| H04B 10/556 | (2013.01) |
| H04L 7/00 | (2006.01) |
| H01S 5/068 | (2006.01) |
| H01S 5/40 | (2006.01) |

(52) U.S. Cl.
CPC .............. G02F 1/39 (2013.01); H01S 5/5054 (2013.01); H04B 10/5561 (2013.01); H04L 7/0075 (2013.01); G02F 2001/354 (2013.01); H01S 5/06821 (2013.01); H01S 5/4006 (2013.01); H01S 5/50 (2013.01)

(58) Field of Classification Search
CPC .............. G02F 2001/354; H04L 7/0075; H01S 5/5054; H01S 5/06821; H01S 5/4006; H01S 5/50
USPC ................................................ 398/173–181
See application file for complete search history.

(56) References Cited

U.S. PATENT DOCUMENTS

| | | | | |
|---|---|---|---|---|
| 5,457,559 A * | 10/1995 | Saito | ..................... | H04L 7/0075 398/155 |
| 5,596,667 A * | 1/1997 | Watanabe | ............. | G02F 1/3538 372/21 |
| 5,798,853 A * | 8/1998 | Watanabe | .......... | H04B 10/2531 359/300 |
| 6,424,774 B1 * | 7/2002 | Takeda | ................. | G02F 1/3536 385/122 |
| 6,459,525 B1 * | 10/2002 | Aso | ........................... | G02F 1/39 359/326 |
| 6,522,818 B1 * | 2/2003 | Aso | ....................... | G02B 6/278 359/341.1 |
| 6,879,433 B1 * | 4/2005 | Yamashita | ............ | G02F 1/3536 359/326 |
| 8,098,989 B2 * | 1/2012 | Yu | .......................... | H04J 14/06 398/183 |
| 9,106,359 B2 * | 8/2015 | Kato | ...................... | H04J 14/02 |
| 2005/0099674 A1 * | 5/2005 | Watanabe | ............. | G02F 1/3538 359/330 |
| 2005/0264871 A1 * | 12/2005 | Takahashi | ............... | G02F 1/353 359/326 |
| 2008/0298813 A1 * | 12/2008 | Song | ................. | H04B 10/25758 398/178 |
| 2009/0052011 A1 * | 2/2009 | Gaeta | ........................ | G02F 1/39 359/326 |
| 2010/0046962 A1 * | 2/2010 | Yu | ....................... | H04B 10/2575 398/178 |
| 2010/0134868 A1 * | 6/2010 | Okuno | .................... | G02F 1/353 359/288 |
| 2011/0176202 A1 * | 7/2011 | Kato | ........................ | G02F 1/395 359/337.5 |
| 2011/0293273 A1 * | 12/2011 | Futami | ................... | G02F 1/3513 398/48 |
| 2012/0020665 A1 * | 1/2012 | Watanabe | ............. | G02F 1/3515 398/65 |
| 2012/0093519 A1 * | 4/2012 | Lipson | ..................... | G01J 11/00 398/157 |
| 2013/0087689 A1 * | 4/2013 | Woodward | ................ | G01J 1/42 250/216 |
| 2013/0155491 A1 * | 6/2013 | McKinstrie | .......... | H04B 10/299 359/326 |
| 2013/0208334 A1 | 8/2013 | Kakande et al. | | |
| 2013/0223459 A1 * | 8/2013 | Radic | ..................... | G02F 1/3534 372/20 |
| 2013/0272702 A1 * | 10/2013 | Yang | .................. | H04B 10/2912 398/48 |
| 2013/0301661 A1 * | 11/2013 | Kakande | ................... | G02F 7/00 370/536 |
| 2014/0043674 A1 * | 2/2014 | Takasaka | ............ | H01S 3/10023 359/334 |
| 2017/0222721 A1 * | 8/2017 | Dailey | .................. | H04B 10/11 |

OTHER PUBLICATIONS

International Search Report for PCT Serial No. PCT/JP2015/053491 dated Apr. 8, 2015.
Kakande J. et al., Multilevel quantization of optical phase in a novel coherent parametric mixer architecture, Nature Photonics, Dec. 2011, p. 748-752, vol. 5.
Slavik R. et al., All-optical phase and amplitude regeneration for next-generation telecommunications systems, Nature Photonics, Oct. 2010, p. 690-695, vol. 4.
Umeki T. et al., In-line phase sensitive amplifier based on PPLN waveguides, Optics Express, May 10, 2013, p. 12077-12084, vol. 21, No. 10.
Kurosu T. et al., Phase regeneration of phase encoded signals by hybrid optical squeezer, Optics Express, May 13, 2014, p. 12177-12188, vol. 22, No. 10.
Kurosu T. et al., Simultaneous Phase Regeneration of CoWDM BPSK Signals by Hybrid Optical Squeezer, OFC 2014, Mar. 9, 2014, p. 103, W3F.5.
Kurosu T. et al., Phase-Regenerative Multicasting of BPSK signals by Hybrid Optical Phase Squeezer, OECC/ACOFT 2014, Jul. 6, 2014, p. 996-998.
Kurosu T. et al., Quadrature Squeezing of Phase Modulated Signals, ICOCN 2014, Nov. 9, 2014, p. 1-4.
Supplementary European Search Report for Serial No. EP 15 75 8258 dated Oct. 2, 2017.

* cited by examiner (a)

(b)

OPTICAL PHASE REGENERATION METHOD AND DEVICE

CROSS REFERENCE TO RELATED APPLICATIONS

The present application claims priority from International Patent Application Serial No. PCT/JP2015/053491 filed on Feb. 9, 2015 and Japanese Patent Application No. 2014-041582 filed on Mar. 4, 2014, the contents of which are hereby incorporated by reference into this application.

TECHNICAL FIELD

The present invention relates to a technique that regenerates a phase of an optical signal in an optical signal regeneration process performed by a repeater for optical communication.

BACKGROUND ART

Recently, a technique of quantizing a phase of light by utilizing an optical parametric process which is one of nonlinear optical phenomena has been developed (J. Kakande, R. Slavik, F. Parmigiani, A. Bogris, D. Syvridis, L. Gruner-Nielsen, R. Phelan, P. Petropoulos, and D. J. Richardson, "Multilevel quantization of optical phase in a novel coherent parametric mixer architecture," Nature Photon. 5, 748-752 (2011)).

The quantization of the optical phase is an important technique that can be utilized in large-capacity optical communication, a high-speed A-D converter, or the like which supports today's advanced information society.

In particular, it is possible to perform an operation such as phase regeneration of multilevel phase shift keying signal light and quadrature phase component separation in the optical communication.

FIG. 1(a) illustrates a relation between a phase of input light and a phase of output light, and FIG. 1(b) illustrates a relation between a phase of input light and a power of output light.

Figure 1:
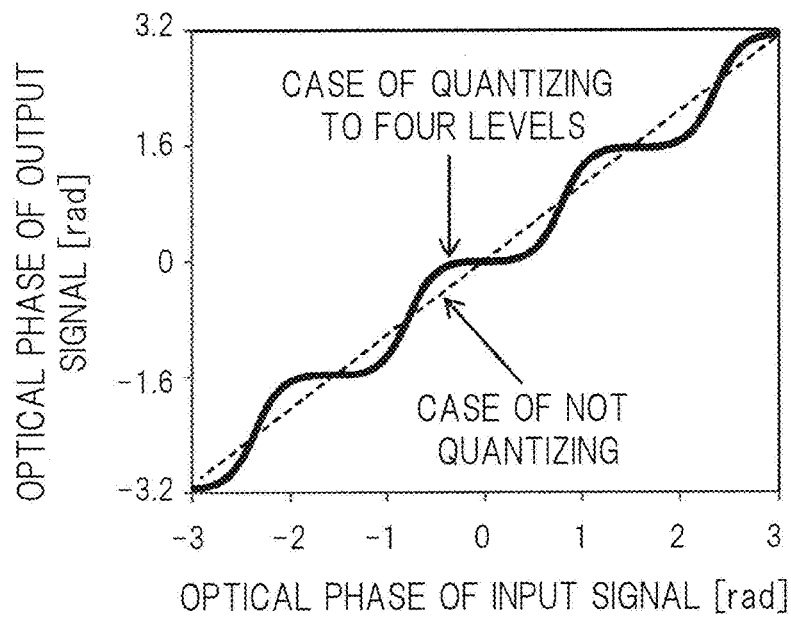
FIG. 1 illustrates a concept that quantizes an optical phase to M levels.
Figure 1:
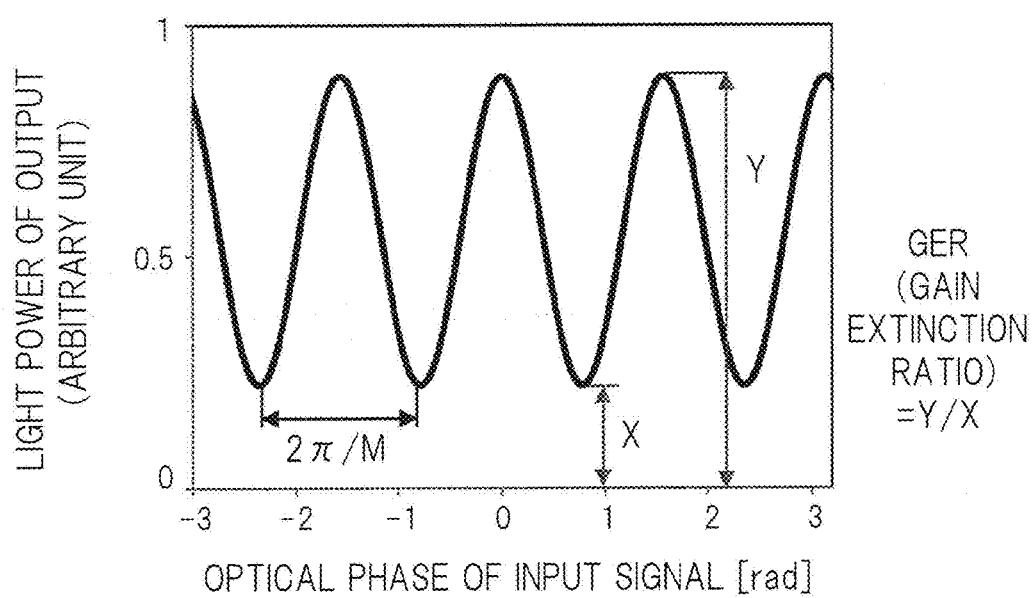

Input and output characteristics illustrated in FIG. 1(a) are to have an effect of suppressing phase noise with respect to M-level phase shift keying (M-PSK) signal light.

In particular, characteristics in the case of M=2 are called quadrature phase squeezing and can be utilized not only for phase regeneration of a BPSK signal but also for separation of a quadrature phase component of the multilevel phase shift keying (n-QAM) signal light.

The quantization of the optical phase can be performed through use of a phase sensitive optical amplifier (Phase Sensitive Amplifier: PSA).

There are various types of the PSA, and the most representative one is a system that is called a dual pump PSA (DP-PSA) in which signal light is multiplexed with two pump light beams, and the multiplexed signal light is introduced into a nonlinear optical medium (WO2013111413).

Figure 2:
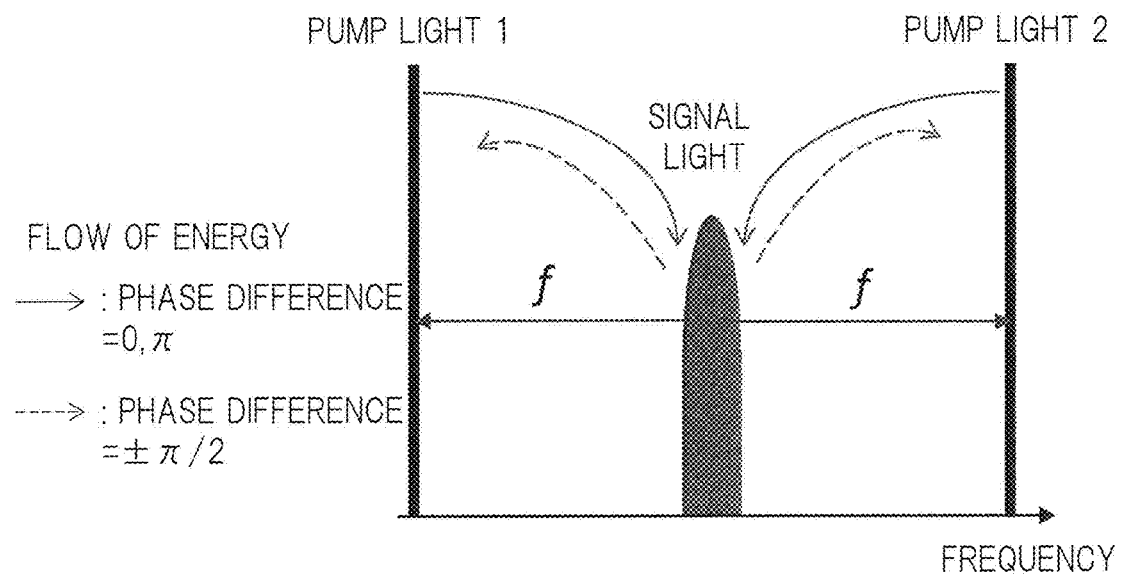

FIG. 2 illustrates wavelength arrangement at the time of performing the phase regeneration of the BPSK signal through use of the DP-PSA.

Two pump light beams are arranged such that an average frequency thereof corresponds to a frequency of the signal light.

When the phase of the signal light is 0 or $\pi$ relative to the average phase of the two pump light beams, a positive optical parametric gain is generated in the nonlinear medium, and the signal light is amplified.

In contrast, when the phase of the signal light is $\pi/2$ and $-\pi/2$, a negative optical parametric gain is generated, and the signal light is attenuated.

That is, the quadrature phase squeezing occurs in which an in-phase component of the signal light is amplified and a quadrature phase component is attenuated.

Figure 3:
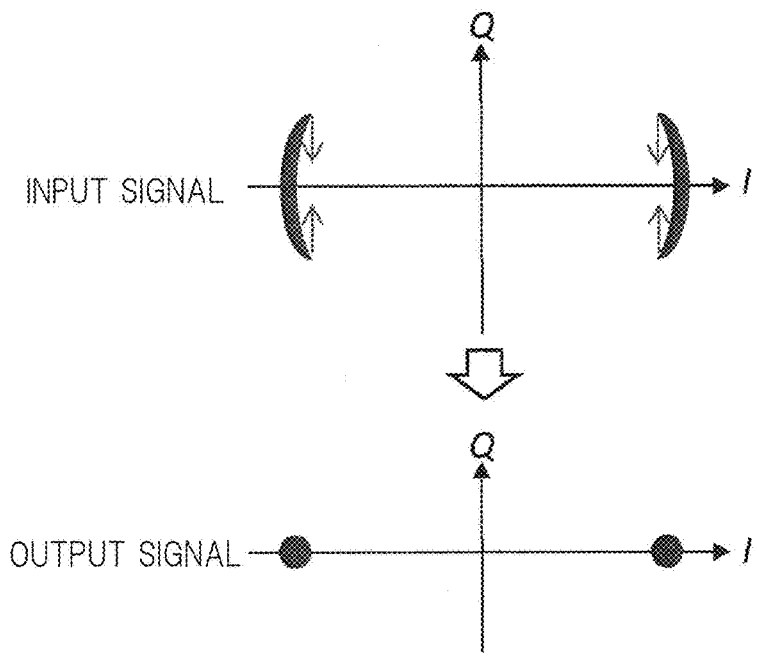

FIG. 3 is a constellation diagram of the BPSK signal where a horizontal axis indicates an in-phase axis and a vertical axis indicates a quadrature phase axis, and FIG. 3 illustrates a state in which the phase noise is suppressed by the quadrature phase squeezing.

Figure 4:
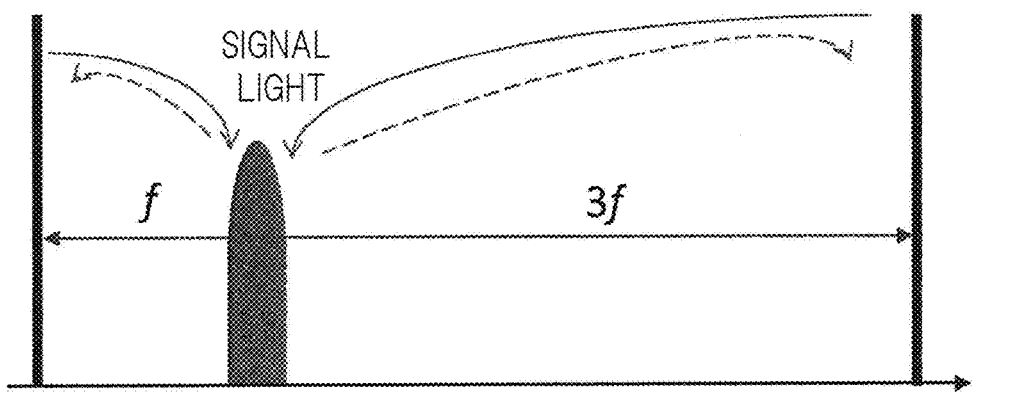

It is also possible to perform phase regeneration of a QPSK signal through use of the DP-PSA in the same manner as that of the BPSK signal, and wavelength arrangement in this regard is illustrated in FIG. 4.

Two pump light beams are arranged such that a frequency difference between pump light 2 and signal light is three times a frequency difference between pump light 1 and the signal light.

When phase differences between the signal light and the two pump light beams are 0, $\pm\pi/2$, and $\pi$, a positive optical parametric gain is generated, and the signal light is amplified.

In contrast, when the phase difference is $\pm\pi/4$ and $\pm3\pi/4$, a negative optical parametric gain is generated, and the signal light is attenuated.

In addition, the PSA is operated in a saturation region, so that simultaneous regeneration of a phase and an amplitude of a phase shift keying signal can also be performed.

An important indicator of the quantization performance is an amount of gain variation accompanying a phase change, that is, a so-called gain extinction ratio (GER).

In general, a high GER of equal to or higher than 25 dB is required in order to perform the quadrature phase squeezing.

It is difficult to achieve such a high GER in the PSA unless a high optical parametric gain is obtained.

Accordingly, a nonlinear optical element with a great nonlinearity, and further, a high breakdown threshold capable of withstanding introduction of high power pump light is required.

Highly nonlinear optical elements having such characteristics have been particularly developed and used in successful examples that have been made so far.

SUMMARY

In the past, a so-called highly nonlinear optical element having an extremely high nonlinearity and high power pump light exceeding 500 mW are required in order to perform the quantization of the optical phase through use of the PSA.

When the PSA is constituted by a general nonlinear optical element, an optical parametric gain with a sufficient magnitude cannot be obtained, and it is difficult to obtain a GER of equal to or higher than 25 dB.

Signal regeneration of a BPSK signal and a QPSK signal and phase separation of a QPSK signal through use of two types of nonlinear optical elements such as a "stimulated Brillouin scattering suppressed nonlinear fiber" and a "periodically poled lithium niobate (PPLN)" have been succeeded so far (R. Slavik, F. Parmigiani, J. Kakande, C. Lundström, M. Sjödin, P. A. Andrekson, R. Weerasuriya, S. Sygletos, A. D. Ellis, L. Grüner-Nielsen, D. Jakobsen, S.

Herstrom, R. Phelan, J. O'Gorman, A. Bogris, D. Syvridis, S. Dasgupta, P. Petropoulous, and D. J. Richardson, "All-optical phase and amplitude regenerator for next-generation telecommunications systems," Nature Photon. 4(10), 690-695 (2010) and T. Umeki, M. Asobe, and H. Takenouchi, "In-line phase sensitive amplifier based on PPLN waveguides," Opt. Express 21(10), 12077-12084 (2013)).

Both the elements have large sizes (about several centimeters) and are not suitable for integration.

In addition, the high power pump light of about 500 mW is needed.

Such a method of using the PSA is not suitable for practical use in terms of the size of the nonlinear optical element and the necessity of the high power pump light, which is a current situation.

In addition, various types of nonlinear optical materials have been developed, but a fact that only the highly nonlinear optical material exhibiting the optical parametric gain can be utilized becomes a cause of hindering a utility value of a technique.

It can be said that achieving the technique of quantizing the optical phase through use of a material capable of being integrated, for example, a semiconductor such as silicon is essential for popularization of the technique.

Currently, a method of enabling quantization of an optical phase with the GER of equal to or higher than 25 dB through use of a material capable of being integrated, including the PSA, has not been known.

The present invention performs quantization of an optical phase through use of a simple four-wave mixing (FWM) which is not accompanied with an optical parametric gain, and a general optical amplifier.

At this time, it is possible to easily obtain a GER of equal to or higher than 30 dB, even if a nonlinear optical element having a low nonlinearity is used.

This method is referred to as a hybrid optical phase squeezer (HOPS) herein, and a principle of the HOPS will be described below.

One of methods of quantizing a phase of input light to M levels (M>=2) is to coherently add phase conjugate light of the input light and (M−1)th phase harmonic light of the input light.

It is possible to generate the phase conjugate light and the phase harmonic light by the four-wave mixing.

Figure 5:
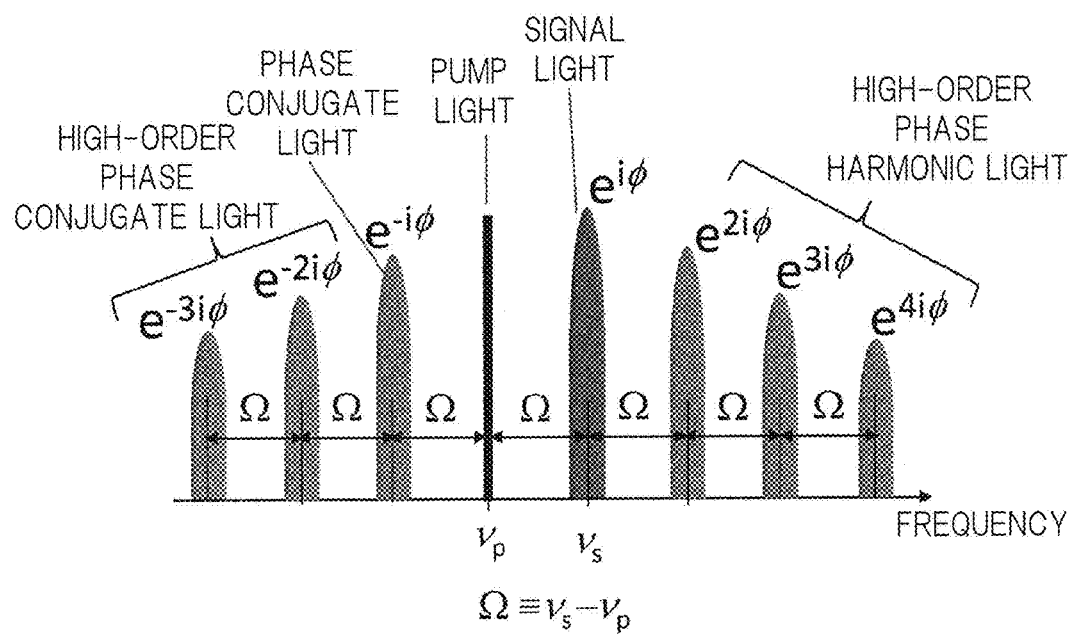
Figure 5:
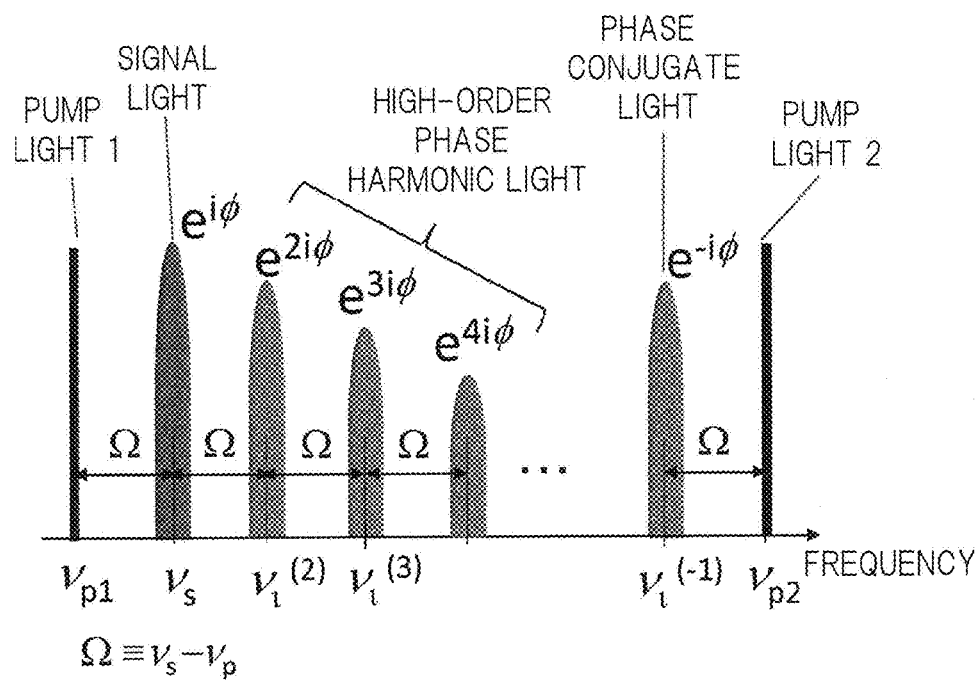

FIGS. 5(a) and 5(b) illustrate a relation of light waves generated when signal light (frequency: $v_s$) is multiplexed with pump light (frequency: $v_p$) and four-wave mixing is performed through use of a nonlinear optical medium.

FIG. 5(a) illustrates the case of using one pump light beam, and FIG. 5(b) illustrates the case of using two pump light beams.

When the phase of the input light is set to be $\phi$, a response (≡A) of light waves synthesized by the above-described coherent addition is given as the following formula (J. Kakande, R. Slavik, F. Parmigiani, A. Bogris, D. Syvridis, L. Gruner-Nielsen, R. Phelan, P. Petropoulos, and D. J. Richardson, "Multilevel quantization of optical phase in a novel coherent parametric mixer architecture," Nature Photon. 5, 748-752 (2011)).

[Formula 1]

$$A = |A| \cdot \exp(i\phi_s) = \exp(i\phi) + m \cdot \exp[-i(M-1)\phi] \quad (1)$$

Herein, $\phi_s$ is a phase of output light, and m is a mixing ratio. In the case of M=2, a maximum GER is obtained, and optimal quantization characteristics are obtained when m≈1 (a mathematical symbol ≈ indicates that a left side value is approximately equal to a right side value, which is the same in the description below).

In the case of M>2, the maximum GER is obtained still when m≈1, but the optimal quantization characteristics are obtained when m=1/(M−1).

FIGS. 1(a) and 1(b) are obtained by plotting $\phi_s$ and |A| which are calculated through use of Formula (1) in the case of M=4 and m=⅓.

A process in which the phase quantization is performed in the PSA is also expressed by Formula (1) in the same manner, but it is difficult to freely control the mixing ratio m because the mixing ratio m depends on various factors.

In general, it is necessary that an extremely high optical nonlinearity is induced in a medium in order to achieve m≈1 in the PSA.

Figure 6:
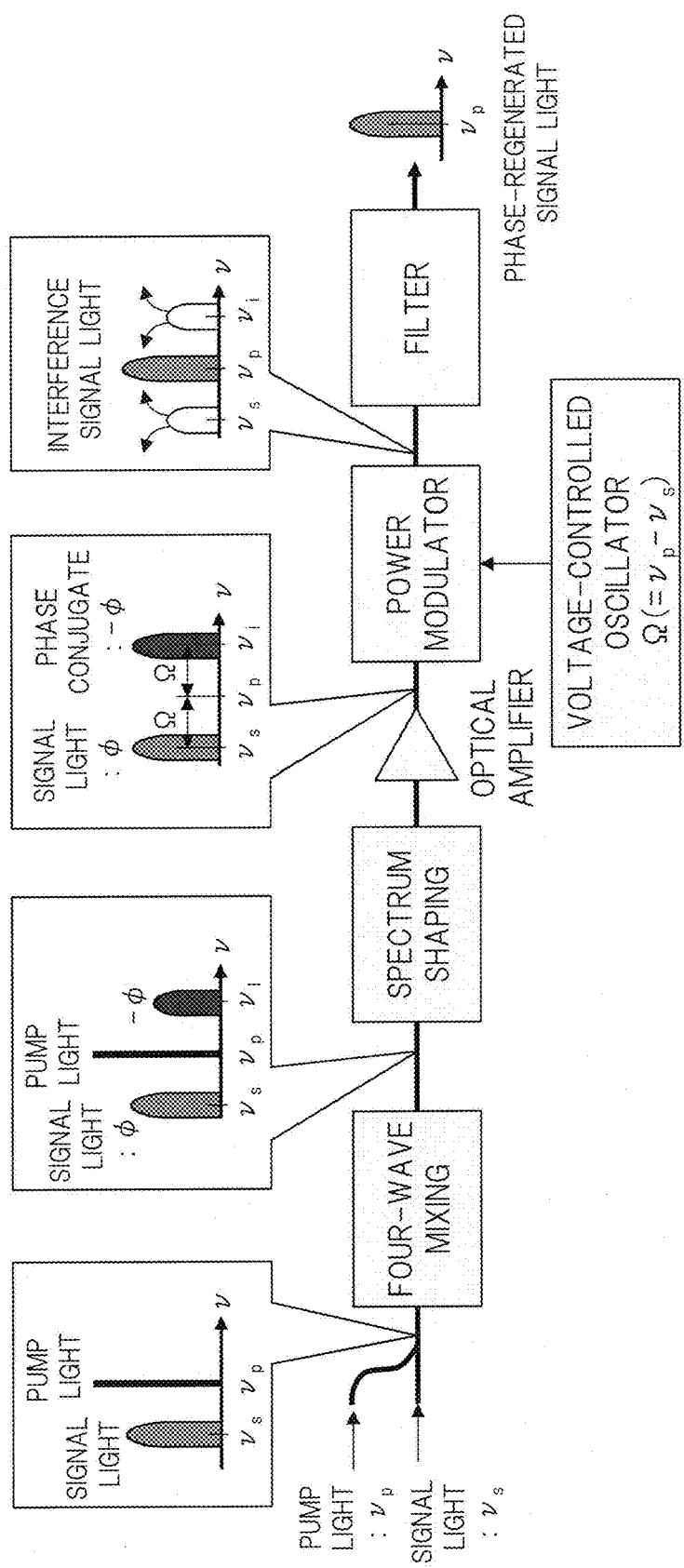

First, a method of quantizing an optical phase to two levels (two-level HOPS) based on Formula (1) is illustrated in FIG. 6.

Signal light (frequency: $v_s$) is multiplexed with pump light (frequency: $v_p$), and then, the multiplexed signal light is introduced into a nonlinear optical element, so that phase conjugate light is generated by the FWM.

Herein, when $v_p > v_s$ is assumed and a frequency difference between the signal light and the pump light is set to be $\Omega$ ($\equiv v_p - v_s$), a frequency of the generated phase conjugate light becomes $v_i = v_p + \Omega$.

The signal light ($e^{i\phi}$) and the phase conjugate light ($e^{-i\phi}$) are taken out from the output of the nonlinear optical element, and each power thereof is set to be equal.

These operations can be performed through use of an attenuator or a reflector which has frequency dependence such as a filter.

The operation of setting each power of the signal light and the phase conjugate light to be equal corresponds to setting the mixing ratio in Formula (1) to m=1.

Next, the signal light and the phase conjugate light are amplified to a suitable level through use of an optical amplifier (for example, an erbium-doped fiber amplifier: EDFA), and then, power modulation is performed.

The power modulation has an effect of splitting the spectra of the input light into two and shifting them to a high-frequency side and a low-frequency side, respectively, by a modulation frequency.

Here, a case in which the modulation frequency (≡f) is equal to the difference frequency between the signal light and the pump light (that is, f=$\Omega$) is considered.

In this case, each frequency of a component ($v'_s = v_s + f$) of the signal light which is shifted to the high-frequency side and a component ($v'_i = v_i - f$) of the phase conjugate light which is shifted to the low-frequency side becomes equal to $v_p$ and is coherently added.

Then, by taking out the interference signal light generated at the frequency $v_p$ with a filter, it is possible to obtain a two-level phase quantized output of the input signal light.

In this method, it is possible to obtain an arbitrarily high GER by accurately matching each power of the signal light and the phase conjugate light.

However, the above-described argument is properly applied only when the assumption, "the modulation frequency is equal to the difference frequency between the signal light and the pump light" is established, which is not easily achieved in practice.

In general, a frequency of signal light or pump light changes at high speed, and even to know a difference frequency therebetween is difficult with existing techniques.

Meanwhile, when the modulation frequency is shifted from the difference frequency between the signal light and the pump light only by δ, the power of the interference signal light varies at a frequency of 2δ.

Reversely, when the modulation frequency is equal to the difference frequency between the signal light and the pump light, the power of the interference signal light is constant.

This means that the above-described assumption is satisfied if the power of the interference signal light is monitored and the modulation frequency is controlled such that the power of the interference signal light is constant.

Thus, in the HOPS, a power modulator is driven with an output of a voltage-controlled oscillator (VCO) and the frequency of the VCO is controlled such that power of the interference signal light becomes constant, so that a stable phase-quantized signal is output.

Here, a state in which "δ=0" is achieved is further considered. When a relative phase is slowly changed while keeping the modulation frequency to be equal to the difference frequency between the signal light and the pump light, the power of the interference signal light varies with a phase period of π=(2π)/2.

This indicates that the interference signal light is the signal obtained by quantizing the phase of the input signal light to two levels.

Accordingly, when a BPSK signal is input, a phase-regenerated BPSK signal is output.

The above-described operation principle of the two-level HOPS has been verified through an experiment in which a semiconductor optical amplifier (SOA) which is a representative integrated device is used for the nonlinear optical element.

Figure 7:
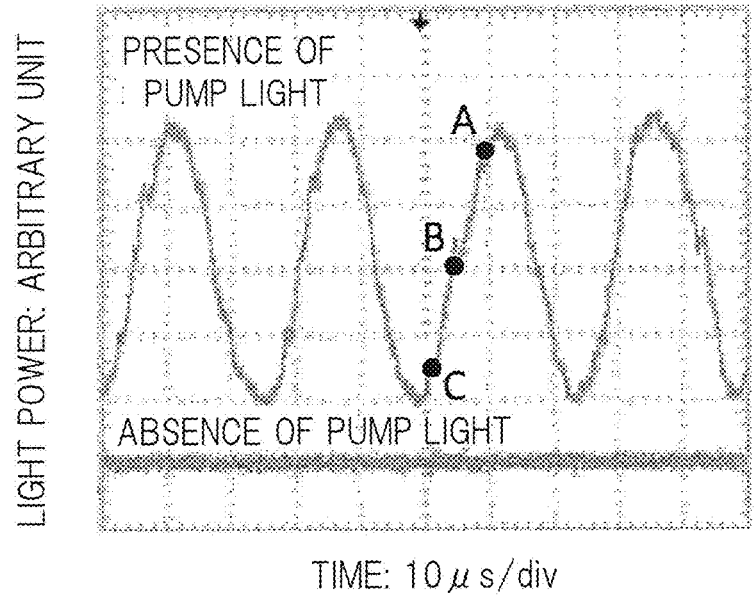
Figure 8:
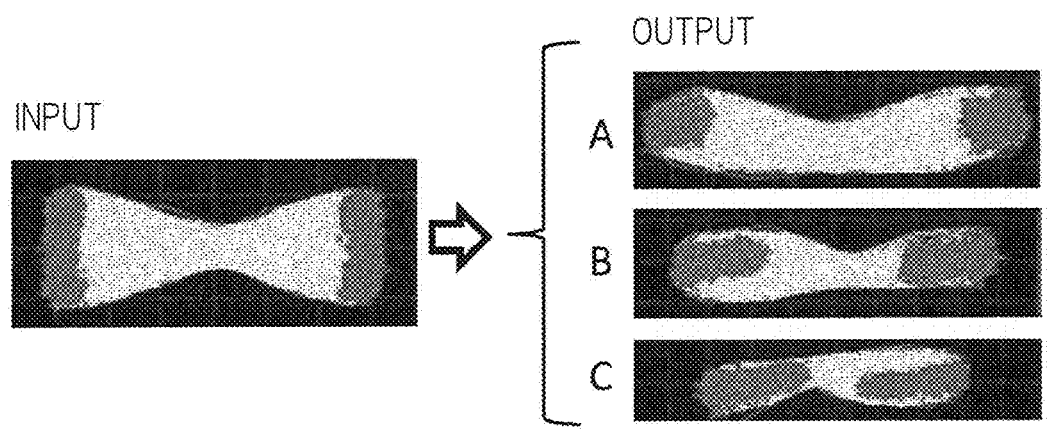

FIGS. 7 and 8 illustrate results of the phase regeneration experiment of the BPSK signal through use of the two-level HOPS.

FIG. 7 illustrates a temporal variation of the interference signal power when the VCO is in the free running condition.

FIG. 8 illustrates the effect of quadrature phase squeezing when a BPSK signal with the phase noise is an input signal.

Herein, constellations (signal points) of an input signal and of output signals in a case in which the power of the interference signal light is stabilized as points A to C of FIG. 7 are illustrated.

It is understood that a BPSK signal with suppressed phase noise is obtained at the time of locking at the point A.

The power of pump light used in this two-level HOPS is 3 mW which is more than two orders of magnitude lower as compared to 500 mW of a representative power of pump light used in the PSA.

In addition, a GER of 40 dB which is hard to achieve in the PSA is obtained even with such low power.

Figure 9:
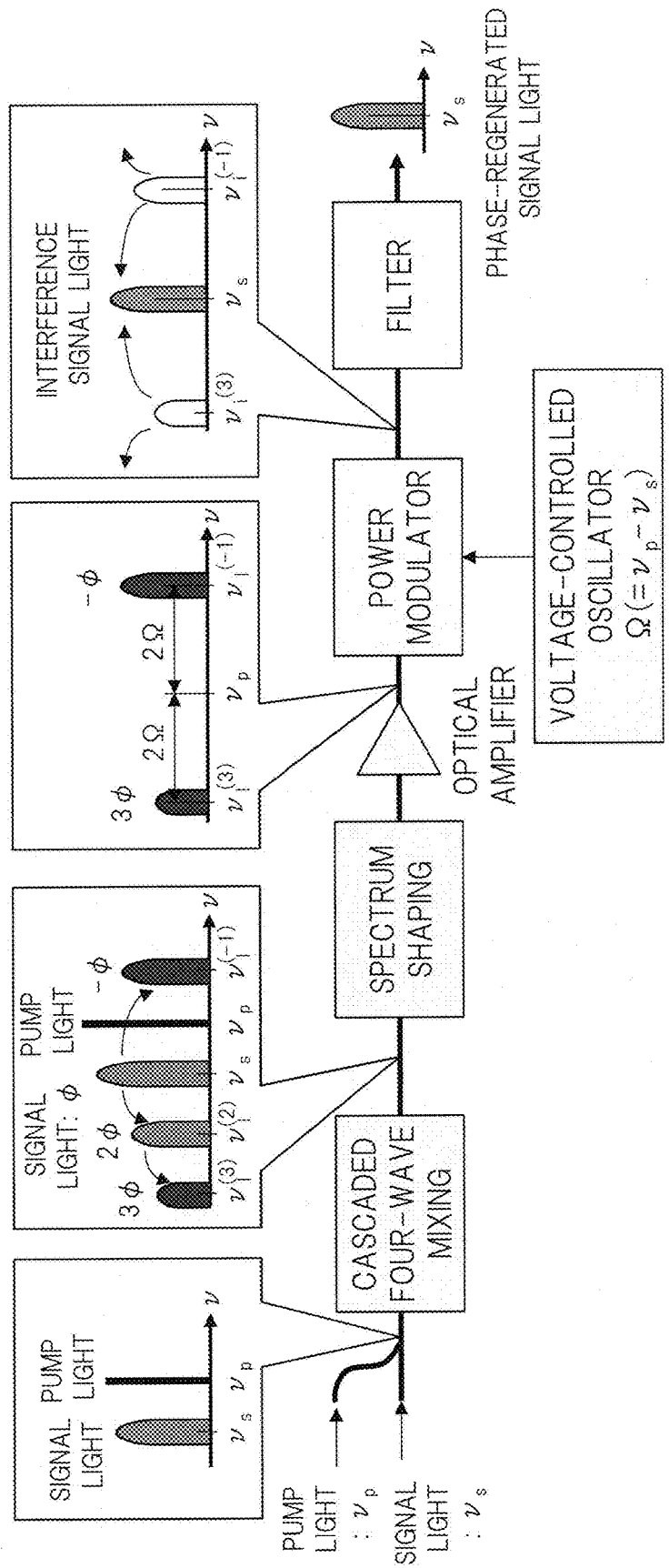

Next, a method of quantizing an optical phase to four levels (four-level HOPS) is illustrated in FIG. 9.

In the same manner as the case of the two-level HOPS, signal light (frequency: $v_s$) is multiplexed with pump light (frequency: $v_p$), and then, the multiplexed signal light is introduced into a nonlinear optical element.

Herein, phase conjugate light ($e^{-i*}$) and third phase harmonic light ($e^{3i*}$) are taken out from the output of the nonlinear optical element by a filter.

When the third phase harmonic light is not taken out with a high S/N ratio by a single FWM, the FWM is cascaded in two stages and an optical amplifier and the filter may be used in the middle.

Next, a power ratio of these two light waves is adjusted through use of the filter or the like to be amplified to a suitable level by the optical amplifier, and then, power modulation is carried out.

When a modulation frequency (=f) is equal to a difference frequency between signal light and pump light, each frequency of a component ($v'^{(-1)}_i = v^{(-1)}_i - 2f$) of the phase conjugate light which is frequency-shifted by twice to the low-frequency side and a component ($v'^{(3)}_i = v^{(3)}_i + 2f$) of the third phase harmonic light which is frequency-shifted by twice to the high-frequency side becomes equal (=$v_s$) to be coherently added.

When a modulation frequency (=f) is equal to twice the difference frequency between the signal light and the pump light, each frequency of a component ($v'^{(-1)}_i = v^{(-1)}_i - f$) of the phase conjugate light which is frequency-shifted to the low-frequency side and a component ($v'^{(3)}_i = v^{(3)}_i + f$) of the third phase harmonic light which is frequency-shifted to the high-frequency side becomes equal (=$v_s$) to be coherently added (not illustrated).

Thus, when interference signal light generated at the frequency $v_s$ is taken out by the filter, it is possible to obtain a four-level phase quantized output of the input signal light.

Herein, it is also possible to obtain an arbitrary GER by adjusting the power ratio between the phase conjugate light and the third phase harmonic light.

In the proof-of-concept experiment of four-level HOPS using SOAs, a GER of equal to or higher than 17 dB, which is hard to achieve in the PSA, has been achieved.

In the same manner, it is possible to quantize the optical phase by coherently adding phase conjugate light ($e^{-i*}$) and (M−1)th phase harmonic light ($e^{(M-1)i*}$) in the case of M other than M=2 and 4.

However, when these light waves are generated through use of one pump light beam (see FIG. 5(a)), a frequency interval becomes larger as M becomes larger, and it is more difficult to superimpose the light waves.

Thus, a system using two pump light beams becomes advantageous in the case of M>4 (see FIG. 5(b)).

The two pump light beams may be obtained from two independent lasers or a single laser with sidebands which are generated by applying modulation.

Nowadays, methods of efficiently generating a large number of sideband waves (called optical combs) from laser light have been developed, and these methods are collectively referred to as an optical comb generator, herein.

Figure 10:
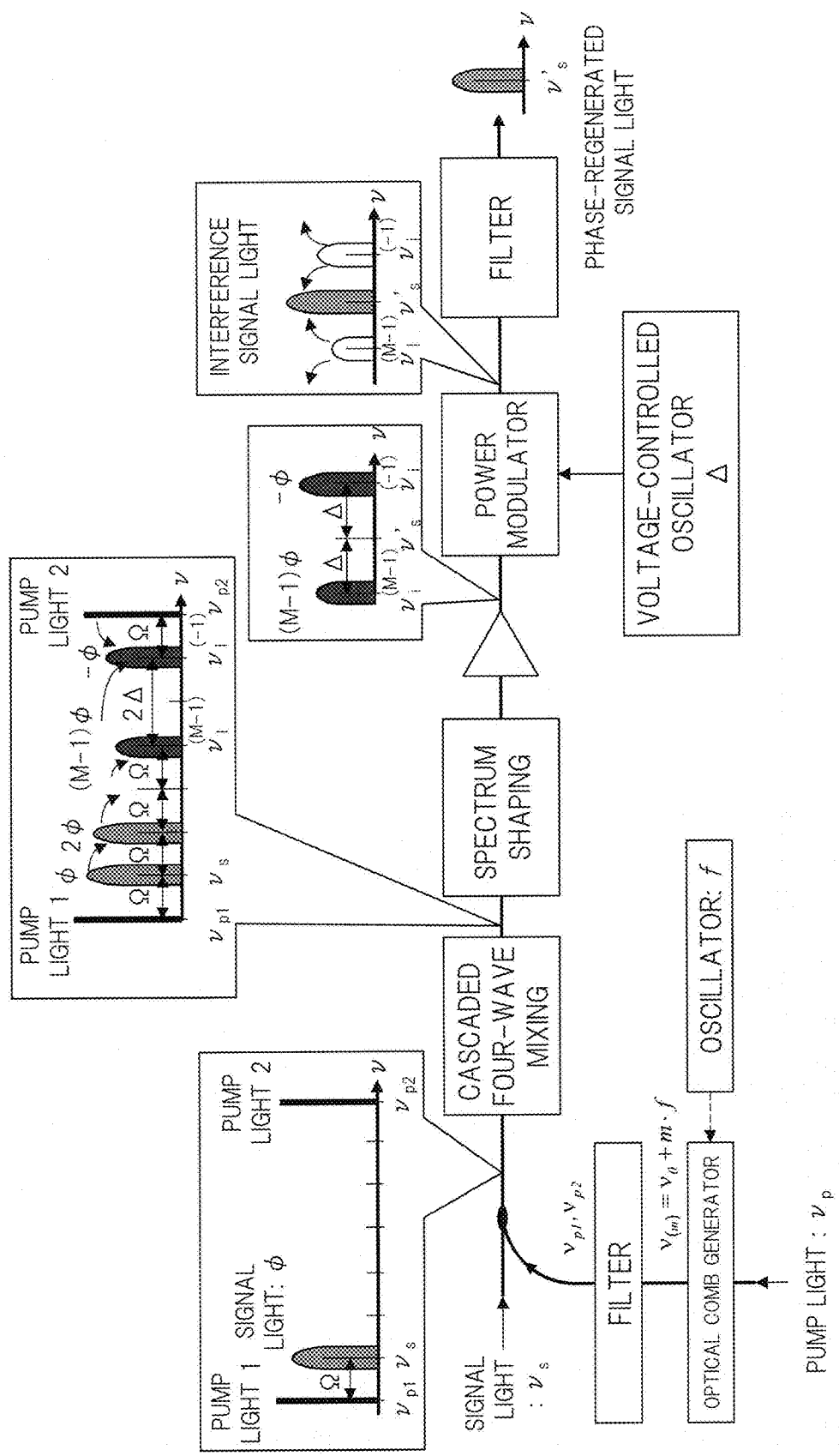

FIG. 10 illustrates a method of quantizing an optical signal to M levels through use of two pump light beams (M-level HOPS (dual-pump system)).

The laser light is introduced into the optical comb generator to generate optical combs, and two modes thereof are extracted as pump light beams through use of a filter.

The signal light is multiplexed with these two pump light beams, the multiplexed signal light is introduced into the nonlinear optical element, and phase conjugate light ($e^{-i*}$) and (M−1)th phase harmonic light ($e^{(M-1)i*}$) which are generated therefrom are extracted by the filter.

A power ratio therebetween is adjusted to be amplified to a suitable level, and then, both light beams are subjected to power modulation to be coherently added.

The modulation frequency used here should be a half of a difference frequency between the generated phase conjugate light and (M−1)th phase harmonic light.

In this dual-pump system, it is possible to constantly match the difference frequency with a frequency that is suitable for driving of a power modulator as long as a frequency of the pump light beam is suitably selected according to a magnitude of M.

Of course, two lasers may be used as pump light sources. There are various advantages that are caused by the fact that two pump light beams are phase locked other than saving the number of lasers in the case of utilizing the optical comb.

Any method other than power modulation may be used as the coherent addition method used in the HOPS, as long as the frequency shift can be performed thereby.

For example, the phase modulation can also be utilized although there is a disadvantage that an original frequency component does not disappear.

It is necessary to shift the optical frequency by 2Ω in the case of the four-level HOPS. When such a process is performed by a single modulator, the power of the frequency-shifted light may become too weak, in some cases.

In such a case, the modulator may be directly driven at 2Ω (f=2Ω), or multiple modulators (the optical amplifier is also used in combination, if necessary) may be used.

The HOPS offers only a function of phase regeneration while simultaneous regeneration of a phase and an amplitude is possible with respect to the BPSK signal or the QPSK signal in the PSA.

However, various techniques in which amplitude regeneration of signal light is performed while preserving a phase have been developed, and it is possible to perform signal regeneration of the BPSK signal or the QPSK signal with low power by using the HOPS and such amplitude regeneration techniques in combination.

A method of the present invention utilizes an optical parametric process without gain, and thus, it is possible to perform optical phase quantization through use of a nonlinear optical element having a low nonlinearity, and operations such as phase regeneration of phase shift keying signal light and quadrature phase separation as applications thereof.

It is easy to perform phase quantization with an arbitrary large GER exceeding 30 dB by changing a parameter, which is different from the PSA.

It is considered to be essential that a device can be realized using a material that allows integration for popularization of the technique of quantizing an optical phase.

In the method according to the present invention, it is possible to utilize a nonlinear optical material, as an element capable of being integrated such as a semiconductor amplifier (SOA) and a silicon waveguide (also including a silicon waveguide of which characteristics are improved by mixing amorphous silicon or an additive, performing coating, or the like), and further, a required power of pump light is also reduced by one or two orders of magnitude as compared to the case of using the PSA.

These effects are extremely important in terms of achieving popularization of an optical signal processing technique in which the optical phase quantization is utilized.

BRIEF DESCRIPTIONS OF THE DRAWINGS

Figure 11:
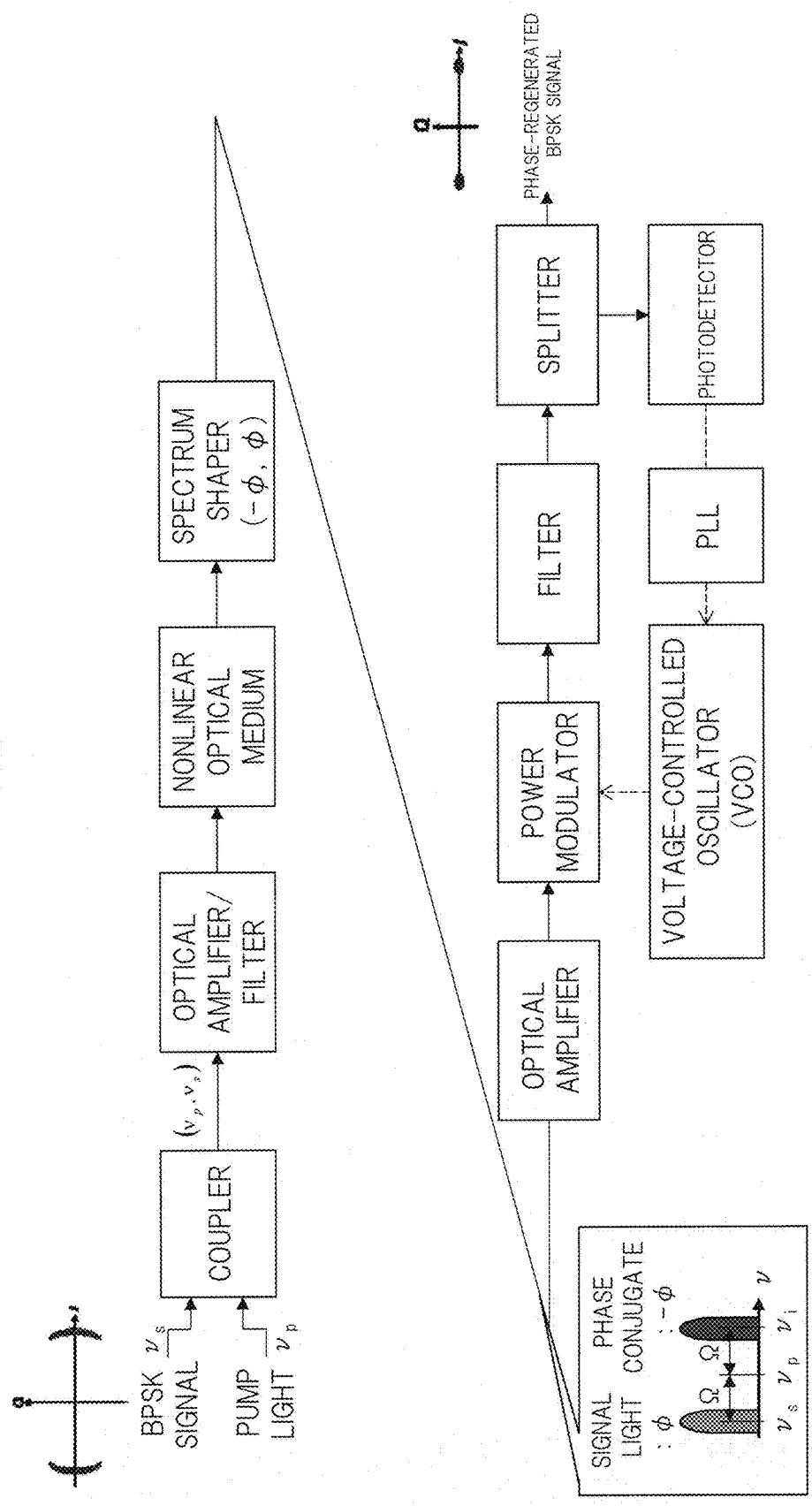
Figure 12:
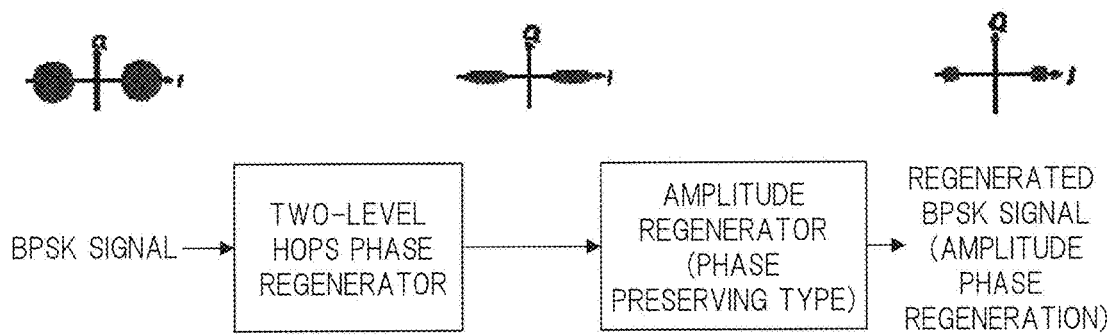
Figure 13:
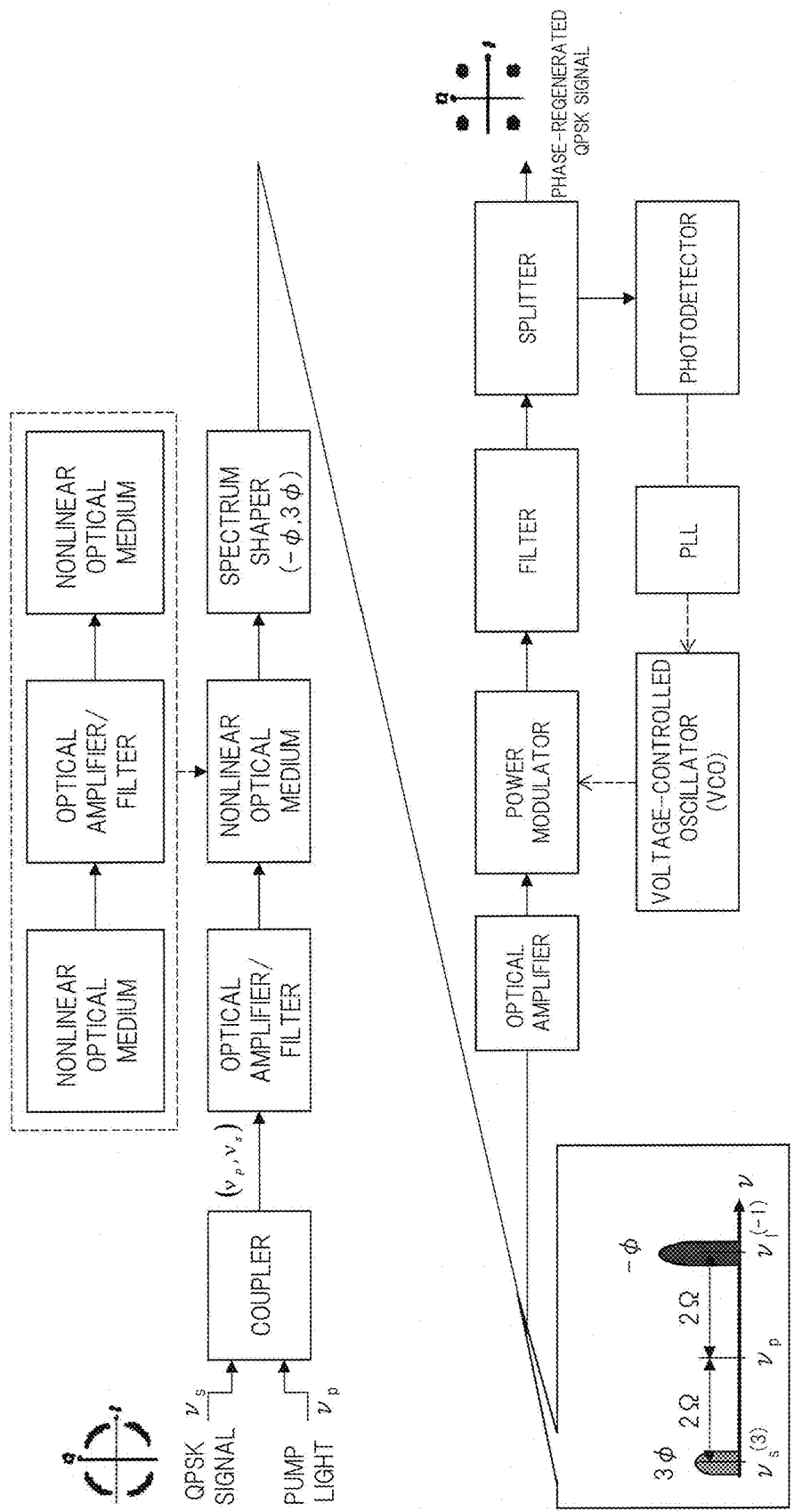
Figure 14:
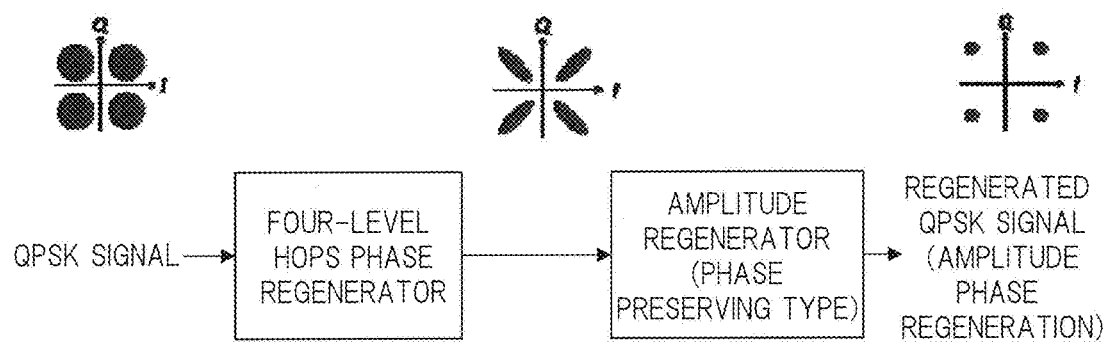
Figure 15:
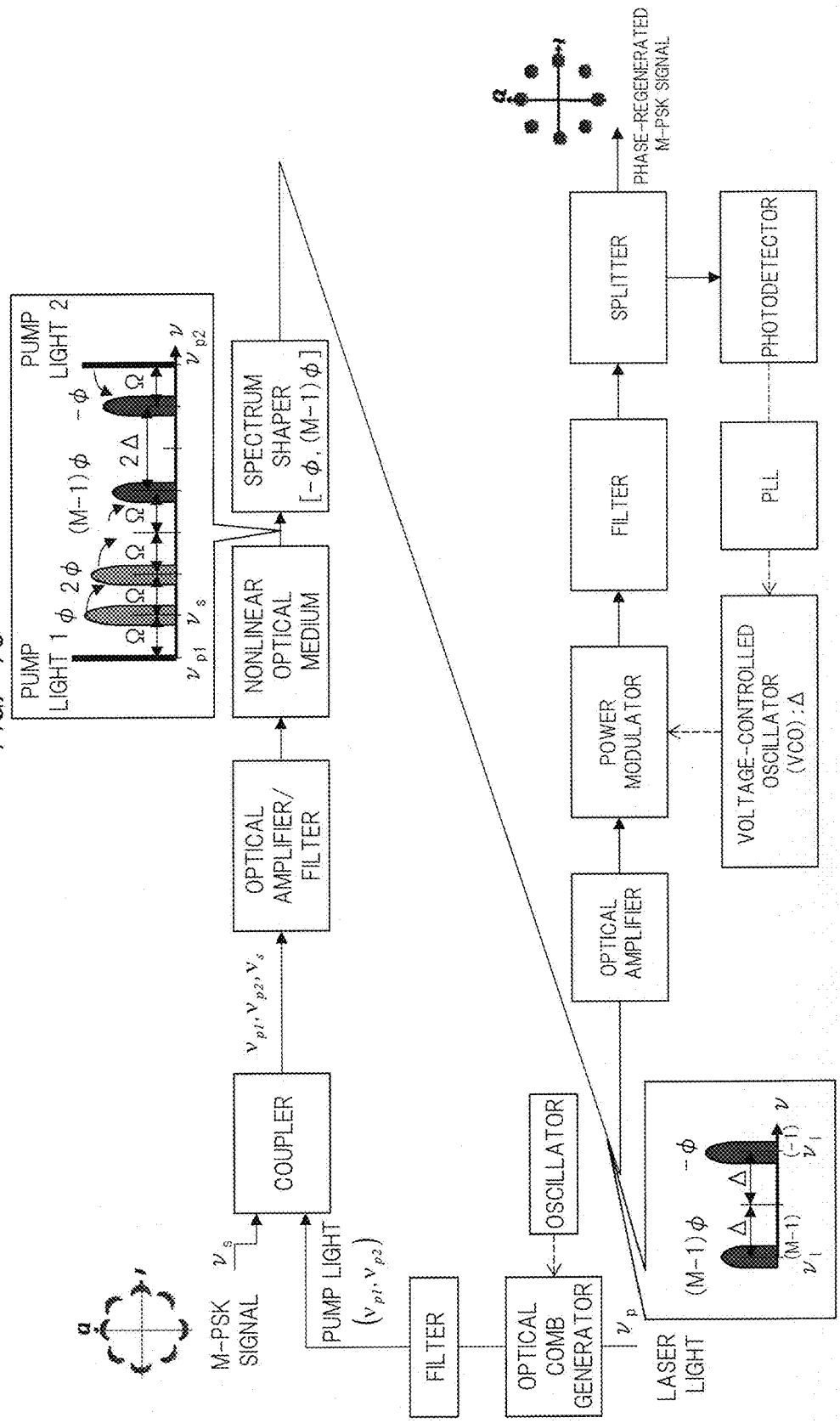
Figure 16:
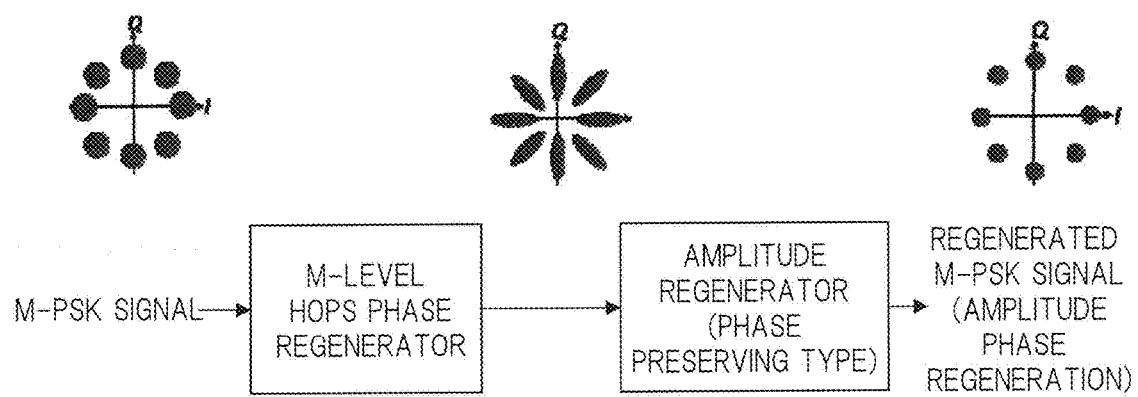
Figure 17:
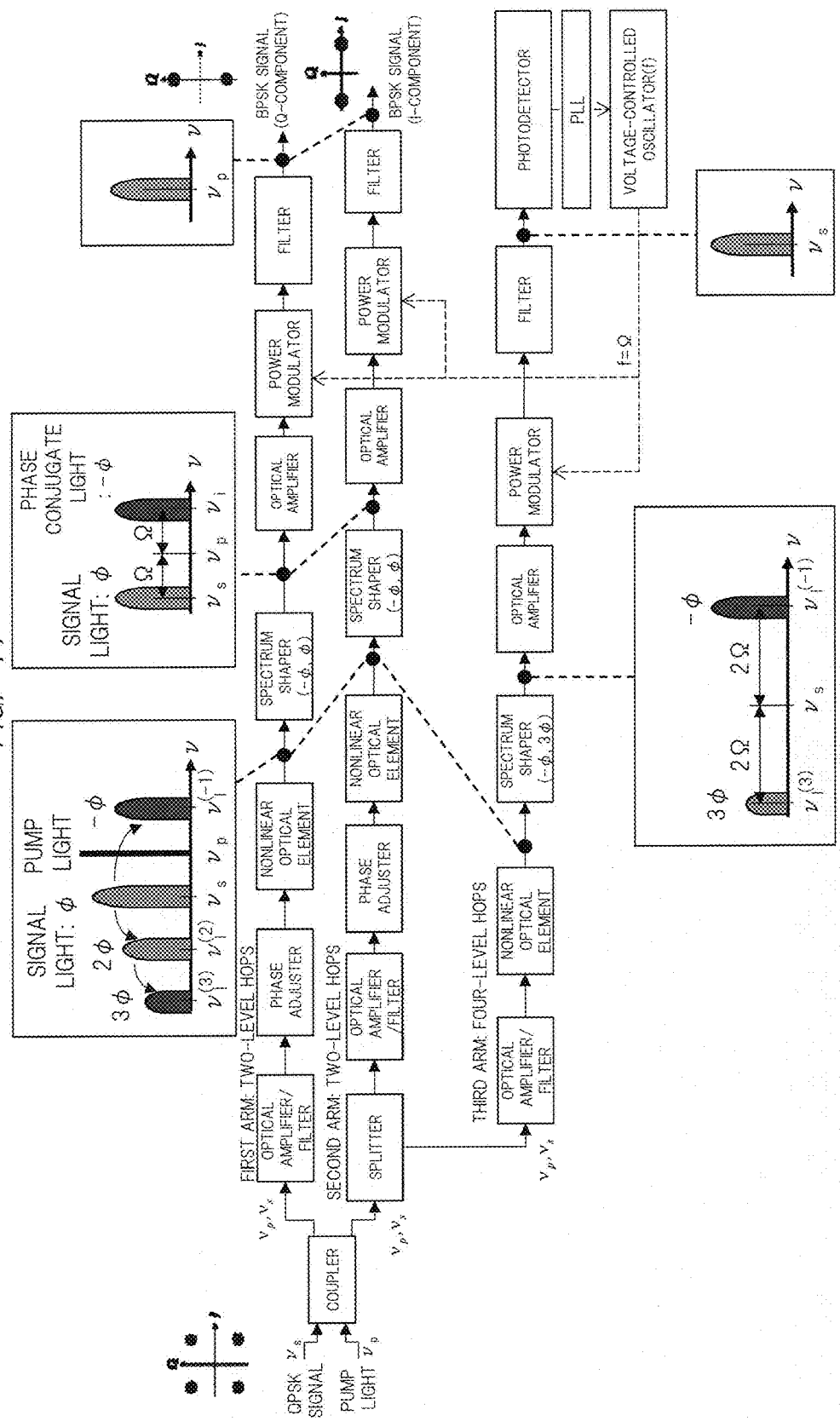

FIG. 1(a) is a diagram illustrating a phase relation between input light and output light in optical phase quantization;

FIG. 1(b) is a diagram illustrating a relation between a phase of input light and power of output light in the optical phase quantization;

FIG. 2 is a diagram illustrating wavelength arrangement at the time of performing phase regeneration of a BPSK signal through use of a DP-PSA;

FIG. 3 is a constellation diagram illustrating a state in which phase noise of the BPSK signal is suppressed by a phase squeezing effect;

FIG. 4 is a diagram illustrating wavelength arrangement at the time of performing phase regeneration of a QPSK signal through use of the DP-PSA;

FIG. 5(a) is a diagram illustrating a relation of light waves generated in four-wave mixing through use of one pump light beam;

FIG. 5(b) is a diagram illustrating a relation of light waves generated in four-wave mixing through use of two pump light beam;

FIG. 6 is a diagram illustrating a principle of a two-level HOPS;

FIG. 7 is a diagram illustrating a temporal variation of interference signal power at the time of free running of a VCO;

FIG. 8 is a constellation diagram illustrating a phase noise suppression effect of the BPSK signal obtained by the two-level HOPS;

FIG. 9 is a diagram illustrating a principle of a four-level HOPS;

FIG. 10 is a diagram illustrating a principle of an M-level HOPS (dual-pump system);

FIG. 11 illustrates an embodiment in which a BPSK signal is subjected to phase regeneration through use of the two-level HOPS;

FIG. 12 is a diagram illustrating an embodiment in which a BPSK signal is subjected to amplitude and signal regeneration through use of the two-level HOPS together with a constellation diagram;

FIG. 13 illustrates an embodiment in which a QPSK signal is subjected to phase regeneration through use of the four-level HOPS;

FIG. 14 is a diagram illustrating an embodiment in which a QPSK signal is subjected to amplitude and signal regeneration through use of the four-level HOPS together with a constellation diagram;

FIG. 15 is a diagram illustrating an embodiment in which an M-level PSK signal is subjected to phase regeneration through use of the M-level HOPS (dual-pump system);

FIG. 16 is a diagram illustrating an embodiment in which an M-level PSK signal is subjected to amplitude and signal regeneration through use of the M-level HOPS (dual-pump system) together with a constellation diagram; and FIG. 17 is a diagram illustrating an embodiment in which a QPSK signal is separated into two BPSK signals by utilizing the HOPS together with a constellation diagram.

DETAILED DESCRIPTION

First Embodiment

FIG. 11 illustrates an embodiment in which a BPSK signal is subjected to phase regeneration through use of a two-level HOPS.

Signal light (frequency: $v_s$) is multiplexed with pump light (frequency: $v_p$), and the multiplexed signal light is amplified to a suitable level and then is introduced into a nonlinear optical element to generate phase conjugate light.

At this time, an optical amplifier generates amplified spontaneous emission light (ASE), and thus, the ASE in a frequency domain in which the phase conjugate light is generated is removed in advance through use of a filter or the like.

When the pump light power is sufficiently high, the optical amplifier and the filter may be omitted.

The output of the nonlinear optical element is guided to a spectrum forming device, a component except for the signal light and the phase conjugate light is removed, and further, the component of signal light (φ) is attenuated such that each power of both light beams becomes equal.

These operations can be performed by using a wavelength-dependent optical element such as a notch filter and a band-pass filter.

This pair of the signal light and the phase conjugate light is guided to a power modulator (may be guided to a phase modulator), and interference signal light (frequency: $v_p$) is output through use of the filter from the output of the power modulator.

A part of the output light is guided to a photodetector by a splitter in order to monitor the power thereof.

The power modulator is driven by a VCO, and the oscillation frequency thereof is feedback-controlled by a phase-locked loop (PLL) such that an output voltage of the photodetector is constant.

Second Embodiment

FIG. 12 illustrates an embodiment in which an amplitude noise and a phase noise of a BPSK signal are suppressed and signal regeneration is performed through use of the two-level HOPS.

The BPSK signal is subjected to the phase regeneration through use of the method illustrated in FIG. 11 and then is introduced into a phase-preserving amplitude regenerator to perform amplitude regeneration.

An example of the phase-preserving amplitude regenerator is an injection-locked semiconductor laser.

Third Embodiment

FIG. 13 illustrates an embodiment in which a QPSK signal is subjected to phase regeneration through use of a four-level HOPS.

Signal light (frequency: $v_s$) is multiplexed with pump light (frequency: $v_p$), and the multiplexed signal light is amplified to a suitable level and then is introduced into a nonlinear optical element to generate phase conjugate light and third phase harmonic light.

At this time, an ASE in a frequency domain in which these light waves are generated is removed in advance through use of a filter or the like.

When the pump light power is sufficiently high, an optical amplifier and the filter may be omitted.

When it is difficult to obtain the third phase harmonic light with a sufficient S/N ratio, the nonlinear optical element may be cascaded in two stages.

At this time, it is possible to obtain a favorable S/N ratio when an output of a nonlinear optical element in the first stage is spectrally shaped by the filter and amplified and then is introduced to a nonlinear optical element in the second stage.

The output of the nonlinear optical element is guided to a spectrum forming device, the components except for the phase conjugate light and the third phase harmonic light are removed, and further, the spectrum shaping is performed such that the two signal light beams have a preferable power ratio.

These operations can be performed by using a wavelength-dependent optical element such as a notch filter and a band-pass filter.

The two power-adjusted signal light beams are guided to a power modulator, and interference signal light (frequency: $v_s$) is output through use of the filter from the output of the power modulator.

A part of the output light is guided to a photodetector by a splitter in order to monitor the power thereof.

The power modulator is driven by a VCO, and the oscillation frequency thereof is feedback-controlled by a PLL such that an output voltage of the photodetector becomes constant.

An object of the power modulator is to shift each frequency of the phase conjugate light and the third phase harmonic light by $2(v_p-v_s)$, and another device such as a phase modulator may be used as long as such an object can be achieved.

Fourth Embodiment

FIG. 14 illustrates an embodiment in which an amplitude noise and a phase noise of a QPSK signal are suppressed and regeneration is performed through use of a four-level HOPS.

The QPSK signal is subjected to phase regeneration through use of the method illustrated in FIG. 13 and then is introduced into a phase-preserving amplitude regenerator to perform amplitude regeneration.

An example of the phase-preserving amplitude regenerator is an injection-locked semiconductor laser.

Fifth Embodiment

FIG. 15 illustrates an embodiment in which an M-level PSK signal (M≥2) is subjected to phase regeneration through use of an M-level HOPS (dual-pump system).

Laser light is introduced into an optical comb generator to generate optical combs, and two modes thereof are extracted as pump light through use of a filter.

Signal light is multiplexed with these two pump light beams, and the multiplexed signal light is introduced into a nonlinear optical element to generate phase conjugate light $((e^{-i\ast}))$ and (M−1)th phase harmonic light $(e^{(M-1)i\ast})$.

At this time, an ASE in a frequency domain in which these light waves are generated is removed in advance through use of a filter or the like.

When it is difficult to obtain the (M−1)th phase harmonic light with a sufficient S/N ratio, the nonlinear optical element may be cascaded in two stages.

At this time, it is possible to obtain a favorable S/N ratio when an output of a nonlinear optical element in the first stage is spectrally shaped by the filter and amplified and then is introduced to a nonlinear optical element in the second stage.

The output of the nonlinear optical element is guided to a spectrum shaper, the components except for the phase conjugate light (frequency: $v_i^{(-1)}$) and the (M−1)th phase harmonic light (frequency: $v_i^{(M-1)}$) are removed, and further, the spectrum shaping is performed such that the two signal light beams have a preferable power ratio.

These operations can be performed by using a wavelength-dependent optical element such as a notch filter and a band-pass filter.

The two power-adjusted light waves are guided to a power modulator and are modulated at a frequency which is the half of a difference frequency between the two light waves.

Interference signal light (frequency: $v'_s=[v_i^{(-1)}+v_i^{(M-1)}]/2$) which is generated at an intermediate frequency of the two light waves is output through use of the filter from the output of the power modulator.

A part of the output light is guided to a photodetector by a splitter in order to monitor the power thereof.

The power modulator is driven by a VCO, and the oscillation frequency thereof is feedback-controlled by a PLL such that an output voltage of the photodetector becomes constant.

Sixth Embodiment

FIG. 16 illustrates an embodiment in which an amplitude noise and a phase noise of an M-level PSK signal is suppressed and regeneration is performed through use of an M-level HOPS (dual-pump system).

The M-level PSK signal is subjected to phase regeneration through use of the method illustrated in FIG. 15 and then is introduced into a phase-preserving amplitude regenerator to perform amplitude regeneration.

An example of the phase-preserving amplitude regenerator is an injection-locked semiconductor laser.

Seventh Embodiment

FIG. 17 illustrates an embodiment in which a QPSK signal is separated into two BPSK signals (composed of data of an I-component and a Q-component of the input QPSK signal, respectively) by using a two-level HOPS and a four-level HOPS in combination.

Signal light is multiplexed with pump light through use of a multiplexer (with two inputs and two outputs) such as a 3-dB coupler. Each of two outputs of the multiplexer is guided to the two-level HOPS (first and second arms).

A part of the output of the multiplexer is divided and guided to the four-level HOPS (a third arm).

All power modulators used in these three HOPSs are driven by the output of the same VCO.

In the first and the second arms, an operation of converting the QPSK signal into the BPSK signals each of which contains only one of components of the QPSK signal is performed through use of a quadrature phase squeezing effect.

In the third arm, an operation of setting a frequency of the VCO to be equal to a difference frequency between the signal light and the pump light is performed.

Phase conjugate light and input signal light are extracted by a filter from the output of the nonlinear optical element and are coherently added in the first and the second arms.

Meanwhile, phase conjugate light and third phase harmonic light are extracted by a filter from the output of the nonlinear optical element and are coherently added in the third arm.

The output of the third arm is the phase-regenerated QPSK signal, and an oscillation frequency of the VCO is constantly kept to be equal to the difference frequency between the signal light and the pump light by controlling the frequency of the VCO such that the power of the QPSK signal is constant.

Accordingly, the first and the second arms function as the two-level HOPS, and the input QPSK signal thereof is influenced by the phase squeezing effect.

Here, it is possible to selectively suppress one component between the two quadrature phase components forming the QPSK signal when a relative phase between the signal light and the pump light is suitably adjusted.

Accordingly, when the relative phase between the signal light and the pump light is adjusted such that the I-component and the Q-component are left, respectively, in the first and the second arms, the two BPSK signals which are separated into the I-component and the Q-component are output.

The present invention is a technique that can be utilized to regenerate signal light which has been degraded in quality during transmission in optical communication and to increase a transmission distance.

In addition, the technique can be utilized for format conversion of multilevel phase shift keying signal light, thereby facilitating flexible operation of all-optical network aiming at low power consumption.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:

1. An optical phase regeneration method of regenerating a phase of binary phase shift keying signal light, the method comprising:

multiplexing the binary phase shift keying signal light whose frequency is $v_s$ and pump light whose frequency is $v_p$ at a predetermined mixing ratio, introducing the multiplexed signal light into a nonlinear optical element, and taking out the signal light and phase conjugate light whose frequency is $v_i^{(-1)}$ by four-wave mixing;

setting each light power of the signal light and the phase conjugate light to a predetermined same level in an optical amplifier; and performing power modulation of the signal light and the phase conjugate light which are set to be the same level, by using a half of a difference frequency between the signal light and the phase conjugate light as a modulation frequency, and generating interference signal light at the frequency $v_p$ of the pump light as phase-regenerated signal light in a light power modulator.

2. The optical phase regeneration method according to claim 1, further comprising:

introducing the generated interference signal light into a phase-preserving amplitude regenerator and performing amplitude regeneration.

3. An optical phase regeneration device that generates a phase of binary phase shift keying signal light, the optical phase regeneration device comprising:

a multiplexer configured to multiplex the binary phase shift keying signal light whose frequency is $v_s$ and pump light whose frequency is $v_p$ at a predetermined mixing ratio;

a nonlinear optical element configured to receive the multiplexed signal light to output the signal light and phase conjugate light whose frequency is $v_i^{(-1)}$ by four-wave mixing;

an optical amplifier configured to set each light power of the signal light and the phase conjugate light to a predetermined same level; and a light power modulator configured to perform power modulation of the signal light and the phase conjugate light which are set to be the same level by using a half of a difference frequency between the signal light and the phase conjugate light as a modulation frequency to generate interference signal light at the frequency $v_p$ of the pump light as phase-regenerated signal light.

4. The optical phase regeneration device according to claim 3 further comprising:

a phase-preserving amplitude regenerator, wherein the generated interference signal light is introduced into the amplitude regenerator and subjected to amplitude regeneration.

* * * * *